(12) United States Patent
Lee et al.

(10) Patent No.: US 8,273,460 B2
(45) Date of Patent: *Sep. 25, 2012

(54) COMPOSITION FOR PREPARING ORGANIC INSULATING FILM, ORGANIC INSULATING FILM PREPARED BY USING THE SAME AND ORGANIC THIN FILM TRANSISTOR COMPRISING THE ORGANIC INSULATING FILM

(75) Inventors: Eun Kyung Lee, Yongin-si (KR); Joo Young Kim, Yongin-si (KR); Sang Yoon Lee, Yongin-si (KR); Jung Seok Hahn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1165 days.

This patent is subject to a terminal disclaimer.

(21) Appl. No.: 11/783,136

(22) Filed: Apr. 6, 2007

(65) Prior Publication Data

US 2008/0067505 A1 Mar. 20, 2008

(30) Foreign Application Priority Data

Sep. 15, 2006 (KR) .................. 10-2006-0089731

(51) Int. Cl.
*B32B 15/04* (2006.01)
*H01L 51/30* (2006.01)
*C08G 65/38* (2006.01)

(52) U.S. Cl. .................. 428/457; 257/40; 257/E51.007; 257/E51.029; 257/E51.031; 257/E51.034; 438/99; 528/210

(58) Field of Classification Search .................. None
See application file for complete search history.

(56) References Cited

U.S. PATENT DOCUMENTS

| 5,981,970 | A | 11/1999 | Dimitrakopoulos et al. |
| 6,849,870 | B2 * | 2/2005 | Koo et al. .................. 257/40 |
| 7,098,525 | B2 * | 8/2006 | Bai et al. .................. 257/642 |
| 7,166,859 | B2 | 1/2007 | Hirose et al. |

FOREIGN PATENT DOCUMENTS

| EP | 1 494 298 A2 | 1/2005 |
| EP | 1 679 754 A1 | 7/2006 |

OTHER PUBLICATIONS

European Search Report dated Apr. 3, 2008, in corresponding European Patent Application No. 08150107.4.

* cited by examiner

*Primary Examiner* — Monique Jackson
(74) *Attorney, Agent, or Firm* — Harness, Dickey & Pierce, P.L.C.

(57) ABSTRACT

Disclosed are a composition comprising an organic insulating polymer in which a photo-reactive functional group showing an increased crosslinking degree is introduced into a sidechain, an organic insulating film comprising the composition, an organic thin film transistor (OTFT) comprising the organic insulating film, an electronic device comprising the organic thin film transistor and methods of fabricating the organic insulating film, the organic thin film transistor and the electronic device. The OTFT comprising the organic insulating film of example embodiments may not show any hysteresis during the driving of the OTFT, and therefore, may exhibit a homogeneous property.

21 Claims, 3 Drawing Sheets

COMPOSITION FOR PREPARING ORGANIC INSULATING FILM, ORGANIC INSULATING FILM PREPARED BY USING THE SAME AND ORGANIC THIN FILM TRANSISTOR COMPRISING THE ORGANIC INSULATING FILM

PRIORITY STATEMENT

This non-provisional application claims priority under 35 U.S.C. §119 to Korean Patent Application No. 2006-89731, filed on Sep. 15, 2006, in the Korean Intellectual Property Office (KIPO), the entire contents of which are herein incorporated by reference.

BACKGROUND

1. Field

Example embodiments relate to a composition for preparing an organic insulating film, an organic insulating film prepared by using the same, an organic thin film transistor (OTFT) comprising the organic insulating film, an electronic device comprising the organic thin film transistor and methods of fabricating the organic insulating film, the organic thin film transistor and the electronic device. Other example embodiments relate to a composition for preparing an organic insulating film comprising an organic insulating polymer in which a photo-reactive functional group showing an increased degree of crosslinking is introduced into a side-chain, to thereby diminish hysteresis of a thin film transistor, an organic insulating film prepared by using the composition, an OTFT comprising the organic insulating film, an electronic device comprising the organic thin film transistor and methods of fabricating the organic insulating film, the organic thin film transistor and the electronic device.

2. Description of the Related Art

A thin film transistor (TFT) has been used as a switching device for controlling driving of each pixel and a driving device for each pixel in a flat panel display device, e.g., a liquid crystal display (LCD) and/or an electroluminescence display (ELD) device. The TFT may be applied to a plastic chip for a smart card or an inventory tag.

This TFT may include a source area and a drain area doped with an increased concentration of impurities, a semiconductor layer having a channel area formed between the two areas, a gate electrode disposed in an area which is insulated with the semiconductor layer and corresponds to the channel area, and a source electrode and a drain electrode contacting with the source area and the drain area, respectively.

A conventional TFT channel layer has been generally made of an inorganic semiconductor material, e.g., silicon (Si), but such inorganic-based material requires an increased cost and increased temperature vacuum process. Therefore, the inorganic-based material has been replaced by an organic-based semiconductor material so that enlargement, cost-reduction and softening of display device is possible. Thus, extensive research on an OTFT using an organic layer as a semiconductor layer is actively underway.

The OTFT may form a thin film as an insulating film through an inexpensive solution procedure, e.g., spin coating. But, trap charge may occur at an interface in view of the intrinsic characteristics of an organic-based material and hysteresis may be caused by polarization owing to external moisture along a sweep direction of gate voltage. For example, when applying a certain strength of voltage to a gate electrode, the strength of current between the source electrode and the drain electrode may correspond to the strength of the applied voltage, and such current strength must be maintained under any circumstances. However, the conventional art OTFT may not be homogeneously maintained due to the occurrence of hysteresis.

SUMMARY

Example embodiments are provided below for addressing certain of the deficiencies and/or limitations of the prior art memory devices through the manufacture and use of a composition for preparing an organic insulating film, which overcomes the above problems by introducing a photo-reactive functional group at a side-chain of an organic insulating polymer and curing the insulating material through UV (ultraviolet) light irradiation and heat treatment, to thereby form an organic insulating film suitable for an OTFT without the occurrence of hysteresis during driving of the OTFT. Example embodiments provide an organic insulating film prepared by using the composition, an OTFT comprising the organic insulating film, an electronic device comprising the organic thin film transistor and methods of fabricating the organic insulating film, the organic thin film transistor and the electronic device.

In accordance with example embodiments, a composition comprising an organic insulating polymer may be represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0).

[Formula 2]

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other.

[Formula 3]

wherein m is an integer ranging from about 1 to about 12.

[Formula 4]

In accordance with example embodiments, an organic insulating film comprising the composition of example embodiments. In accordance with still other example embodiments, there is provided an OTFT comprising a substrate, and a gate electrode, a gate insulating film, an organic semiconductor layer and source/drain electrodes on a substrate wherein the gate insulating film includes the organic insulating film of example embodiments. In accordance with other example embodiments, there is provided an electronic device comprising the organic thin film transistor of example embodiments.

In accordance with other example embodiments, a method of fabricating an organic insulating film may include forming the organic insulating film including a composition comprising an organic insulating polymer represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0).

[Formula 2]

$$-(R_1)_k-(R_2)$$

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other.

[Formula 3]

wherein m is an integer ranging from about 1 to about 12.

[Formula 4]

In accordance with example embodiments, a method of fabricating an organic thin film transistor (OTFT) may include forming a gate electrode, a gate insulating film, an organic semiconductor layer, a source electrode and a drain electrode on a substrate, wherein the gate insulating film includes the organic insulating film fabricated according to example embodiments.

In accordance with example embodiments, a method of fabricating an electronic device may include fabricating the organic thin film transistor according to example embodiments.

BRIEF DESCRIPTION OF THE DRAWINGS

Example embodiments will be more clearly understood from the following detailed description taken in conjunction with the accompanying drawings. FIGS. 1-4 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be explained in more detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A composition for preparing an organic insulating film according to example embodiments may be an organic insulating polymer represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0).

[Formula 2]

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other.

[Formula 3]

wherein m is an integer ranging from about 1 to about 12.

[Formula 4]

The insulating film prepared within the limited ranges of m, n, x, y, i and j of Formula 1 described above may exhibit improved qualities and effects. Also, preparing an insulating film in any ranges deviating from the above ones may be possible, but there is a possibility that deterioration in properties may occur due to undesirable quality of a thin film.

The organic insulating polymer of Formula 1 may be an organic insulating polymer represented by the following Formula 5:

[Formula 5]

wherein R is represented by Formula 2 as defined above; the sum of x and y is 1; x is a real number ranging from about 0.1 to about 0.9; y is a real number ranging from about 0.1 to about 0.9; and p is a real number ranging from about 10 to about 100.

For example, the organic insulating polymer may be an organic insulating polymer represented by any one of the following Formulas 6 and 7:

[Formula 6]

wherein p is a real number ranging from about 10 to about 100; and

[Formula 7]

wherein p is a real number ranging from about 10 to about 200.

Example embodiments may have a photo-reactive functional group showing an increased degree of crosslinking on a side-chain of an organic insulating polymer used as a raw material for a gate insulating film and curing it through UV irradiation and heat treatment, thereby preventing or reducing the occurrence of hysteresis during the driving of an OTFT by inhibiting charge trap at an interface between an organic semiconductor layer and an organic insulating film or polarization caused by external moisture.

The composition for preparing an organic insulating film of example embodiments may further include a crosslinking agent for improving a crosslinking degree. Examples of the crosslinking agent employable in example embodiments may include, but may not be limited to, one or more selected from the group consisting of dipentaerythritol pentaacrylate, dipentaerythritol hexaacrylate, polyethylene glycol diacrylate and polyethylene glycol dimetacrylate. This crosslinking agent may be used in the amount of about 10% to about 40% by weight based on the total amount of the composition.

Examples of a solvent usable in the composition for preparing an organic insulating film of example embodiments may include an aliphatic hydrocarbon solvent, e.g., hexane; an aromatic hydrocarbon solvent, e.g., anisole, mesitylene and/or xylene; a ketone-based solvent, e.g., methyl isobutyl ketone, 1-methyl-2-pyrrolidinone or acetone; an ether-based solvent, e.g., cyclohexanone, tetrahydrofuran or isopropyl ether; an acetate-based solvent, e.g., ethyl acetate, butyl acetate or propylene glycol methyl ether acetate; an alcohol-based solvent, e.g., isopropyl alcohol or butyl alcohol; an amide-based solvent, e.g., dimethylacetamide or dimethylformamide; a silicon-based solvent; and a mixture thereof.

In example embodiments, the composition for preparing an organic insulating film may include about 5% to about 15% by weight of the organic insulating polymer, about 10% to about 40% by weight of a crosslinking agent based on the organic insulating polymer, and a residual amount of a solvent.

In accordance with example embodiments, there is provided an organic insulating film which is prepared by coating the composition of example embodiments on a substrate and curing the same. Such organic insulating film may be prepared by using any one of existing wet coating methods. For example, the organic insulating film of example embodiments may be prepared by a method, e.g., spin coating, dip coating, printing, spray coating, roll coating, screen printing and/or ink spraying, but there is no limitation on the method.

The curing step for forming an organic insulating film may be conducted by appropriately combining UV irradiation and heat treatment, but such curing conditions may be varied depending on the type of organic insulating polymer to be used and a constitution of an organic insulating film composition. In example embodiments, the substrate coated with the organic insulating film composition may be subjected to heat treatment at about 70° C. for about 2 minutes so as to evaporate the solvent followed by irradiating UV light onto the substrate, to form a crosslinking bridge between the organic insulating polymer molecules. In order to further increase a curing degree after curing through UV light, the substrate may be heated at a temperature in the range of about 150° C. to about 250° C. for about 30 minutes to 2 hours. The organic insulating polymer of Formula 1 used in example embodiments may include a photo-reactive functional group on a side-chain, thereby forming a rigid thin film when cured by heat treatment and/or UV light.

The organic insulating film of example embodiments may exhibit an improved insulating property; the preparation thereof may be more easily done by a typical wetting process, e.g., printing and/or spin coating; and an OTFT using the same may exhibit an increased charge mobility and an improved current on/off ratio ($I_{on}/I_{off}$).

In the OTFT of example embodiments, the magnitude of current between the source electrode and the drain electrode may be determined by only the strength of voltage applied to the gate electrode, without depending on the change in the state applied to such OTFT. The OTFT of example embodiments may not show any hysteresis but may exhibit an homogeneous property.

In addition, example embodiments provide an OTFT comprising the organic insulating film as a gate insulating film. For example, the OTFT according to example embodiments may include a substrate, a gate electrode, a gate insulating film, an organic semiconductor later and drain/source electrodes, and may be characterized by preparing the gate insulating film using the organic insulating film composition of example embodiments.

Figure 1:
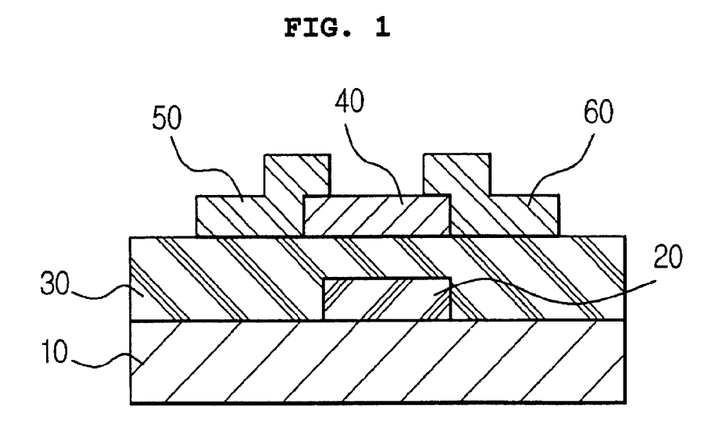
FIG. 1 is a sectional diagram schematically illustrating a top contact structure of an OTFT of example embodiments.
Figure 2:
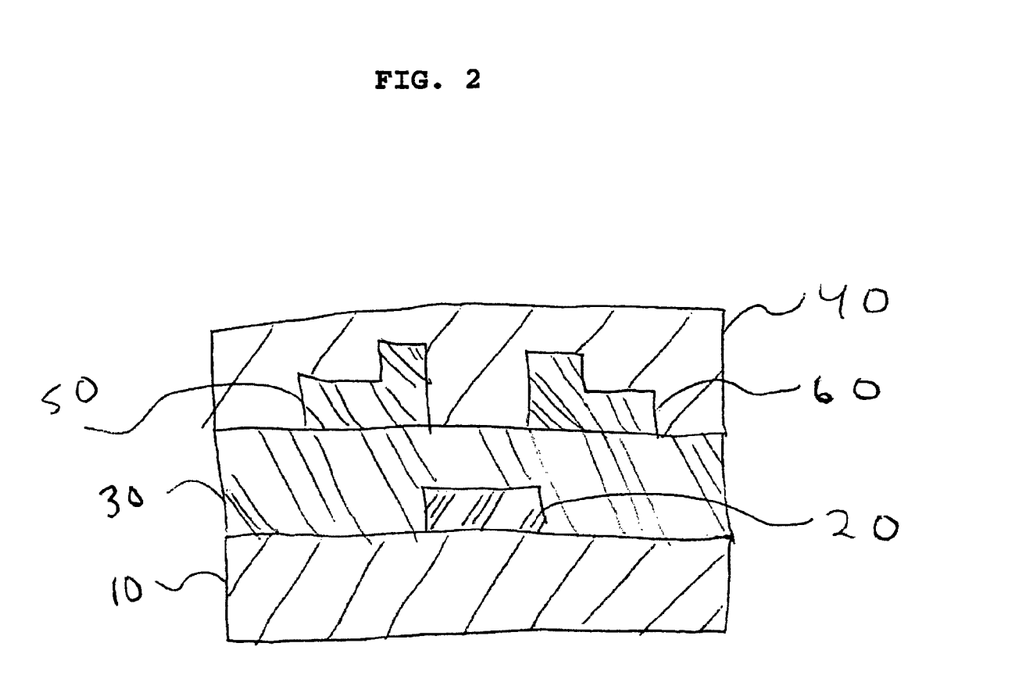
FIG. 2 is a sectional diagram schematically illustrating a bottom contact structure of an OTFT of example embodiments.
Figure 3:
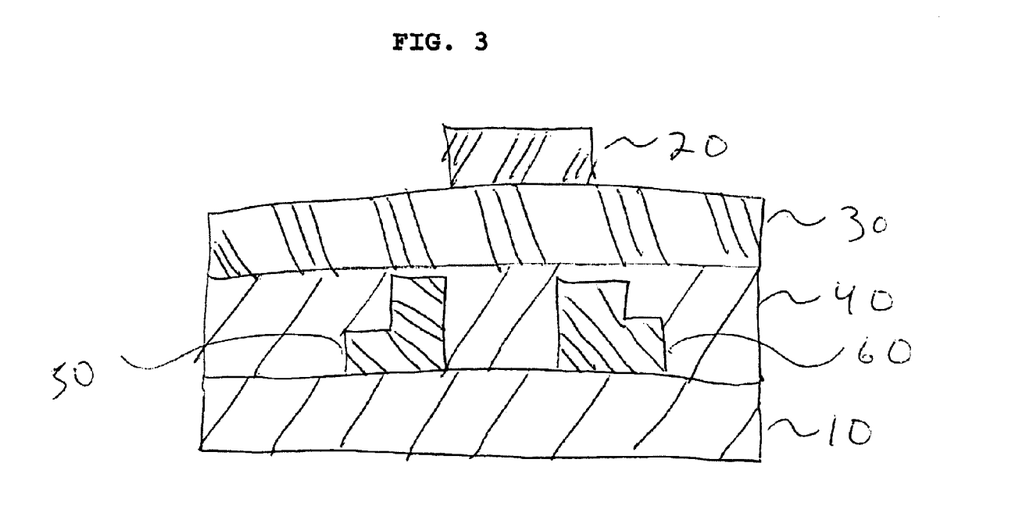
FIG. 3 is a sectional diagram schematically illustrating a top gate structure of an OTFT of example embodiments.

The OTFT of example embodiments may have no limitation on the structure, and may have a top contact structure, a bottom contact structure or a top gate structure. For example, the OTFT of example embodiments may have a top contact structure where a gate electrode 20, a gate insulating film 30, an organic semiconductor layer 40, a source electrode 50 and a drain electrode 60 are orderly laminated on a substrate 10, as illustrated in FIG. 1, or a bottom contact structure where a gate electrode 20, a gate insulating film 30, a source electrode 50, a drain electrode 60 and an organic semiconductor layer 40 are orderly laminated on a substrate 10, as illustrated in FIG. 2. The OTFT of example embodiments may also have a top gate structure where a source electrode 50 and a drain electrode 60, an organic semiconductor layer 40, a gate insulating film 30, and a gate electrode 20 are orderly laminated on a substrate 10, as illustrated in FIG. 3.

The substrate 10 in the OTFT of example embodiments may be any substrate of glass, a silicon wafer, polyethylene terephthalate (PET), polycarbonate (PC), polyethersulfone (PES) and polyethylene naphthalate (PEN).

The organic semiconductor layer 40 may be any one of organic semiconductor layers conventionally used in the art, and particular examples thereof may include pentacene, copper phthalocyanine, polythiophene, polyaniline, polyacetylene, polypyrrole, polyphenylene vinylene or a derivative thereof, but may not be limited thereto.

Each of the gate electrode 20, the source electrode 50 and the drain electrode 60 may be made of any one of generally used metals, and particular examples thereof may include Au, Ag, Ni, indium tin oxide (ITO), Al or Cr, but are not limited thereto.

In accordance with example embodiments, an electronic device may include the organic thin film transistor according to example embodiments. Because the composition of example embodiments serves to improve the device characteristics of an organic thin film transistor, the composition may be effectively used to fabricate a variety of electronic devices, including liquid crystal display (LCD) devices, photovoltaic devices, organic light-emitting devices (OLEDs), sensors, memory devices and/or integrated circuits. These electronic devices may be fabricated using the composition of example embodiments by any common process.

In accordance with example embodiments, a method of fabricating an organic insulating film may include forming the organic insulating film including a composition comprising an organic insulating polymer represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0).

[Formula 2]

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other.

[Formula 3]

wherein m is an integer ranging from about 1 to about 12.

[Formula 4]

In accordance with example embodiments, a method of fabricating an organic thin film transistor (OTFT) may include forming a gate electrode, a gate insulating film, an organic semiconductor layer, a source electrode and a drain electrode on a substrate, wherein the gate insulating film includes the organic insulating film fabricated according to example embodiments.

The semiconductor layer may be made of a material selected from the group consisting of pentacene, copper phthalocyanine, polythiophene, polyaniline, polyacetylene, polypyrrole, polyphonylene vinylene and a derivative of the materials. The gate electrode, the source electrode and the drain electrode may be made of a material selected from the group consisting of gold (Au), silver (Ag), nickel (Ni), aluminum (Al), indium tin oxide (ITO) and chrome (Cr). The substrate may be made of a material selected from the group consisting of glass, a silicon wafer, polyethylene terephthalate (PET), polycarbonate (PC), polyethersulfone (PES) and polyethylene naphthalate (PEN). The OTFT may have a top contact structure, a bottom contact structure or a top gate structure.

In accordance with example embodiments, a method of fabricating an electronic device may include fabricating the organic thin film transistor according to example embodiments.

Example embodiments will now be described in more detail with reference to the following examples. However, the following examples are given for the purpose of illustration and are not to be construed as limiting the scope of example embodiments.

EXAMPLES

Example 1

Preparation of an Organic Insulating Polymer

Coumarin-oxyhexylbenzoic acid (BHC-coumarin) was synthesized according to the following procedure.

After 50 g of 7-hydroxycoumarin (0.308 mol, 1.0 eq) was added to 1 l of acetone, 85.13 g of potassium carbonate (0.616 mol, 2 eq) and 150.3 g of 1,6-dibromohexane (0.616 mol, 2 eq) were added thereto and the mixture was refluxed for 24 hours. Then, the reaction mixture was filtered and subjected to evaporation to remove the solvent. The filtrate thus obtained was mixed with ether and water and extracted with ether. Next, the resulting compound so obtained was recrystalized with hexane, to obtain a compound 1 (about 64.89 g, about 65% yield).

The solids thus separated were recrystalized with ethanol, to obtain coumarin-oxyhexylbenzoic acid (compound 3) (about 40 g, about 80% yield).

After about 48.78 g of the compound 1 obtained above (about 0.15 mol, about 1 eq) was added to about 750 ml of acetone, about 62 g of potassium carbonate (about 0.75 mol, about 3 eq) and about 24.93 g of ethyl-4-hydroxybenzoate (about 0.15 mol, about 1 eq) were added thereto and the mixture was refluxed for 24 hours. And then, the reaction mixture was filtered, and the filtrate obtained therefrom was washed with chloroform and subjected to evaporation to remove the solvent. The resulting compound was recrystalized with ethanol, to obtain a compound 2 (about 53.74 g, about 87.3% yield).

After about 53.74 g of the compound 2 (about 0.13 mol, about 1.0 eq) was added to about 600 ml of ethanol, about 600 ml of about 1 M NaOH was added thereto and the mixture was stirred for about 48 hours. Next, the reaction mixture was acidified with about 10% HCl and filtered to separate solids.

After about 5 g of coumarin-oxyhexylbenzoic acid (compound 3) (about 13.075 mol, about 1 eq) was added to about 100 ml of methylene chloride under nitrogen atmosphere, about 1.71 g of thiochloride (about 14.383 mol, about 1.1 eq) was added thereto and the mixture was stirred at about 35° C. for about 5 hours. Then, the reaction mixture was subjected to evaporation to remove the solvent and recrystalized with ethylacetate/hexane, to obtain coumarin-oxyhexylbenzoyl chloride (compound 4).

6

About 1.685 g of polyhydroxymaleimide-polyhydroxystyrene polymer (5) (about 5.45 mol, about 0.42 eq) was dissolved in about 20 ml of tetrahydrofuran (THF) under nitrogen atmosphere and then cooled down to about 0° C. Next, about 1.985 g of triethylamine (about 19.61 mol, about 1.5 eq) was added to the mixture and stirred for about 1 hour. Coumarin-oxyhexylbenzoyl chloride synthesized above was added to the resulting mixture at about 0° C., and heated to about room temperature, and then, stirred for a day. After that, the reaction mixture was poured into a mixture of methanol and water, to thereby precipitate solids. The solids were removed by filtration, and the filtrate obtained therefrom was extracted with methanol, to obtain a white solid form of organic insulating polymer 6 (about 6 g, about 43% yield).

Example 2

Preparation of an Organic Insulating Polymer

7

About 1.685 g of polyhydroxymaleimide-polyhydroxystyrene polymer (about 5.45 mol, about 0.42 eq) was dissolved in about 20 ml of tetrahydrofuran (THF) under nitrogen atmosphere and then cooled down to about 0° C. Then, about 1.985 g of triethylamine (about 19.61 mol, about 1.5 eq) was added to the mixture and stirred for about 1 hour. And, about 1.37 g of metaacryloyl chloride (about 13.08 mol, about 1.0 eq) was added to the resulting mixture at about 0° C., and heated to about room temperature, and then, stirred for a day. The reaction mixture was poured into a mixture of methanol and water, to thereby precipitate solids. The solids were removed by filtration, and the filtrate obtained therefrom was extracted with methanol, to obtain a white solid form of organic insulating polymer 7 (about 1.5 g, about 58% yield).

Example 3

Preparation of OTFT

A gate electrode in a thickness of about 2000 Å was formed on a washed glass substrate by using Al according to a vacuum deposition method. Then, the organic insulating polymer synthesized in Example 1 and DPHA (dipentaerythritol penta/hexa-acrylate) as a crosslinking agent were mixed in a weight ratio of about 4:1 and dissolved in cyclohexanone as a solvent at a concentration of about 10% by weight. The resulting solution was subjected to spin coating on the gate electrode and the substrate as illustrated in FIG. 1 and dried at about 70° C. for about 2 minutes to remove the solvent. And then, the substrate was irradiated with an about 200 W high pressure mercury lamp having a wavelength range of about 240 nm to about 400 nm for about 2 minutes, and heated at about 200° C. for about 1 hour, to thereby form a gate insulating film in a thickness of about 500 nm to about 1,000 nm.

Thereafter, a polythiophene-based polymer as a semiconductor raw material was dissolved in chloroform at a concentration of about 1% by weight, and the resulting solution was subjected to spin coating on the gate insulating film formed on the substrate in a thickness of about 50 nm to about 100 nm. Then, the substrate was heated at about 100° C. for about 1 hour, to thereby form an organic semiconductor layer. An OTFT of a top contact structure was prepared by using Au as source/drain electrodes and a shadow mask having a channel length of about 100 μm and a channel width of about 1 mm according to a vacuum deposition method.

Figure 4:
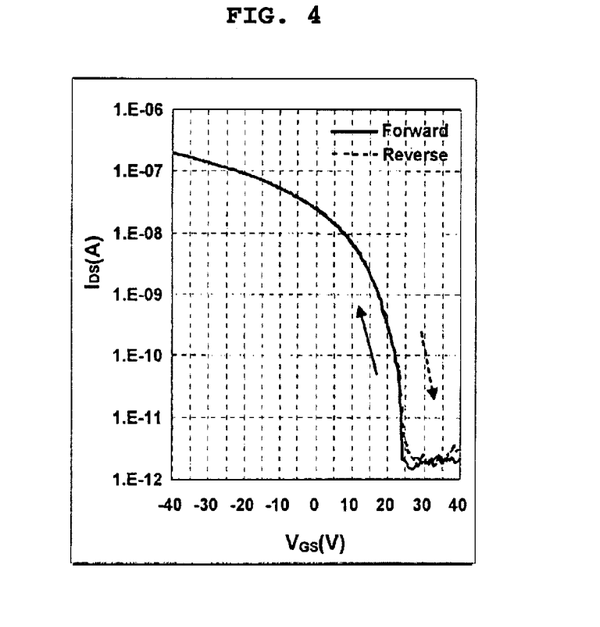
FIG. 4 is a current transfer characteristic curve of an OTFT prepared in Example 3.

A current transfer characteristic curve of the OTFT thus prepared was measured in a saturation regime of $V_{SD}=(-40V)$ by using a semiconductor characterization system 4200-SCS (manufactured by KEITHLEY Instruments Inc.) and the results are shown in FIG. 4. A charge mobility was calculated based on the following Mathematical Formula 1 of the saturation regime by using the current transfer characteristic curve and the results are shown in Table 1.

Comparative Example 1

Preparation of OTFT

A gate electrode in a thickness of about 2,000 Å was formed on a washed glass substrate by using Al according to a vacuum deposition method. Then, the organic insulating polymer synthesized in Example 1 and DPHA as a crosslinking agent were mixed in a weight ratio of about 4:1 and dissolved in cyclohexanone as a solvent at a concentration of about 10% by weight. The resulting solution was subjected to spin coating on the gate electrode and the substrate as illustrated in FIG. 1 and dried at about 70° C. for about 2 minutes so as to remove the solvent. Next, the substrate was heated at about 200° C. for about 1 hour, to thereby form a gate insulating film in a thickness of about 500 nm to about 1,000 nm.

Thereafter, a polythiophene-based polymer as a semiconductor raw material was dissolved in chloroform at a concentration of about 1% by weight, and the resulting solution was subjected to spin coating on the gate insulating film formed on the substrate in a thickness of about 50 nm to about 100 nm. And then, the substrate was heated at about 100° C. for about 1 hour, to thereby form an organic semiconductor layer. An OTFT of a top contact structure was prepared by using Au as source/drain electrodes and a shadow mask having a channel length of about 100 μm and a channel width of about 1 mm according to a vacuum deposition method.

Figure 5:
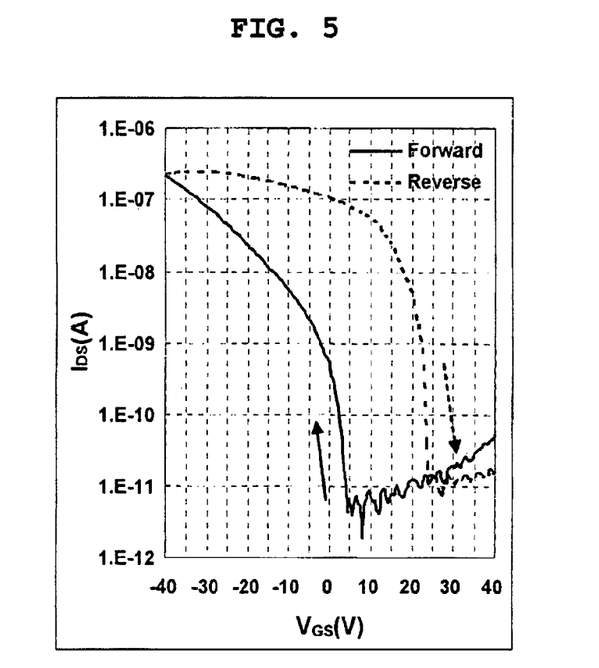
FIG. 5 is a current transfer characteristic curve of an OTFT prepared in Comparative Example 1.

A current transfer characteristic curve of the OTFT obtained above was measured in a saturation regime of $V_{SD}=(-40V)$ by using a semiconductor characterization system 4200-SCS as defined above and the results are shown in FIG. 5. A charge mobility was calculated based on the following Mathematical Formula 1 of the saturation regime by using the current transfer characteristic curve and the results are shown in Table 1.

Example 4

Preparation of OTFT

A gate electrode in a thickness of about 2000 Å was formed on a washed glass substrate by using Al according to a vacuum deposition method. Then, the organic insulating polymer synthesized in Example 2 and DPHA as a crosslinking agent were mixed in a weight ratio of about 4:1 and dissolved in cyclohexanone as a solvent at a concentration of about 10% by weight. The resulting mixture was subjected to spin coating on the gate electrode and substrate as illustrated in FIG. 1 and dried at about 70° C. for about 2 minutes to remove the solvent. And then, the substrate was irradiated with an about 200 W high pressure mercury lamp having a wavelength range of about 240 nm to about 400 nm, and heated at about 200° C. for about 1 hour, to thereby form a gate insulating film in a thickness of about 500 nm to about 1,000 nm.

Thereafter, a polythiophene-based polymer as a semiconductor raw material was dissolved in chloroform at a concentration of about 1% by weight, and the resulting solution was subjected to spin coating on the gate insulating film formed on the substrate in a thickness of about 50 nm to about 100 nm. And then, the substrate was heated at about 100° C. for about 1 hour, to thereby form an organic semiconductor layer. An OTFT of a top contact structure was prepared by using Au as source/drain electrodes and a shadow mask having a channel length of about 100 μm and a channel width of about 1 mm according to a vacuum deposition method.

Figure 6:
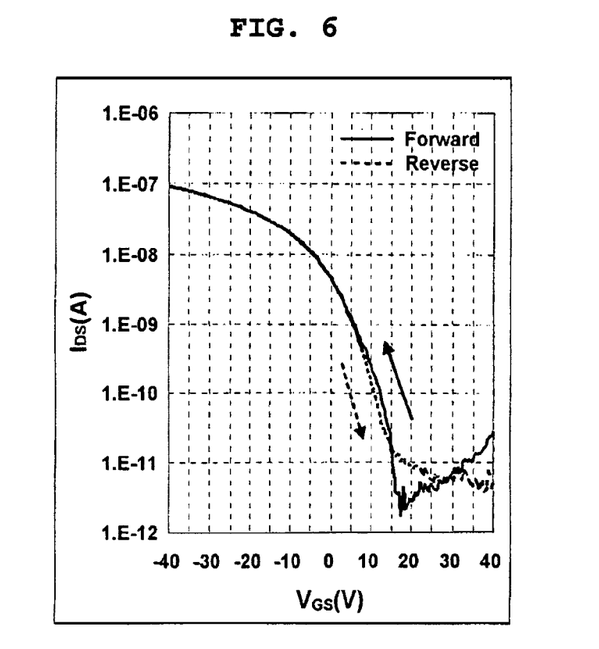
FIG. 6 is a current transfer characteristic curve of an OTFT prepared in Example 4.

A current transfer characteristic curve of the OTFT obtained above was measured in a saturation regime of $V_{SD}=(-40V)$ by using a semiconductor characterization system 4200-SCS as defined above and the results are shown in FIG. 6. A charge mobility was calculated based on the following Mathematical Formula 1 of the saturation regime by using the current transfer characteristic curve and the results are shown in Table 1.

TABLE 1

|  | Charge mobility(cm²/Vs) | Current on/off ratio | Hysteresis(V) |
| --- | --- | --- | --- |
| Example 3 | 0.011 | $1.4 \times 10^5$ | 0 |
| Comparative Example 1 | 0.008 | $1.4 \times 10^5$ | 33 |
| Example 4 | 0.003 | $1.8 \times 10^5$ | 2 |

$$I_{SD} = \frac{WC_0}{2L}\mu(V_G - V_T)^2 \qquad \text{[Mathematical Formula 1]}$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is a source-drain current; $\mu_{FET}$ is a charge ability; $C_0$ is oxide capacitance, W is a channel width, L is a channel length, $V_G$ is a gate voltage, and $V_T$ is a threshold voltage.

As apparent from the foregoing, because the organic insulating polymer used in the preparation of an organic insulating film composition according to example embodiments includes a photo-reactive functional group showing an increased crosslinking degree at a side chain, it may prevent or reduce the occurrence of hysteresis due to a charge trap at the interface between a gate insulating film and an organic semiconductor layer of an OTFT and temporary polarization of an insulating material. Therefore, the OTFT comprising the organic insulating film which is prepared by using the organic insulating film composition of example embodiments may exhibit a homogeneous property without the occurrence of hysteresis.

Because the organic insulating polymer used in the organic insulating film composition of example embodiments may form a rigid thin film because of its increased crosslinking degree, the organic insulating film of example embodiments may have advantages in that it improves processability and shows improved properties as an insulator.

Although example embodiments have been disclosed for illustrative purposes, those skilled in the art will appreciate that various modifications, additions and substitutions are possible, without departing from the scope and spirit of the accompanying claims.

What is claimed is:

1. A composition comprising an organic insulating polymer represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0),

[Formula 2]

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other,

[Formula 3]

wherein m is an integer ranging from about 1 to about 12,

[Formula 4]

2. The composition according to claim 1, wherein the organic insulating polymer is a polymer represented by the following Formula 5:

[Formula 5]

wherein R has the same meaning as defined in claim 1; the sum of x and y is about 1; x is a real number ranging from about 0.1 to about 0.9; y is a real number ranging from about 0.1 to about 0.9; and p is a real number ranging from about 10 to about 100.

3. The composition according to claim 1, wherein the organic insulating polymer is a polymer represented by any one of the following Formulas:

[Formula 6]

wherein p is a real number ranging from about 10 to about 100; and

[Formula 7]

wherein p is a real number ranging from 10 to 200.

4. The composition according to claim 1, further comprising:
one or more crosslinking agents selected from the group consisting of dipentaerythritol pentaacrylate, dipentaerythritol hexaacrylate, polyethylene glycol diacrylate and polyethylene glycol dimethacrylate.

5. The composition according to claim 1, wherein the composition includes about 5% to about 15% by weight of the organic insulating polymer, about 10% to about 40% by weight of a crosslinking agent based on the organic insulating polymer and a residual amount of a solvent.

6. The composition according to claim 5, wherein the solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent and a mixture thereof.

7. An organic insulating film comprising the composition according to claim 1.

8. The organic insulating film according to claim 7, wherein the organic insulating film is formed by using any one of spin coating, dip coating, printing, spray coating, roll coating, screen printing and ink spraying.

9. An organic thin film transistor (OTFT) comprising a substrate, and a gate electrode, a gate insulating film, an organic semiconductor layer, a source electrode and a drain electrode on the substrate, wherein the gate insulating film includes the organic insulating film of claim 7.

10. The OTFT according to claim 9, wherein the semiconductor layer is made of a material selected from the group consisting of pentacene, copper phthalocyanine, polythiophene, polyaniline, polyacetylene, polypyrrole, polyphenylene vinylene and derivatives thereof.

11. The OTFT according to claim 9, wherein the gate electrode, the source electrode and the drain electrode are made of a material selected from the group consisting of gold (Au), silver (Ag), nickel (Ni), aluminum (Al), indium tin oxide (ITO) and chrome (Cr).

12. The OTFT according to claim 9, wherein the substrate is made of a material selected from the group consisting of glass, a silicon wafer, polyethylene terephthalate (PET), polycarbonate (PC), polyethersulfone (PES) and polyethylene naphthalate (PEN).

13. The OTFT according to claim 9, wherein the OTFT has a top contact structure, a bottom contact structure or a top gate structure.

14. An electronic device comprising the organic thin film transistor according to claim 9.

15. A method of fabricating an organic insulating film comprising forming the organic insulating film including a composition comprising an organic insulating polymer represented by the following Formula 1:

[Formula 1]

wherein R is represented by the following Formula 2; the sum of m and n is about 1; m is a real number ranging from about 0.1 to about 0.9; n is a real number ranging from about 0.1 to about 0.9; the sum of x and y is about 1; x is a real number ranging from about 0.1 to about 0.9; y is a real number ranging about 0.1 to about 0.9; the sum of i and j is about 1; and i and j are a real number ranging from about 0 to about 1, respectively (j≠0),

[Formula 2]

wherein $R_1$ is one or more selected from the group consisting of functional groups represented by the following Formula 3; $R_2$ is one or more selected from the group consisting of photo-reactive functional groups represented by the following Formula 4; k is an integer ranging about 0 to about 3; and if $R_1$ is plural, they are identical to or different from each other,

[Formula 3]

-continued wherein m is an integer ranging from about 1 to about 12,

[Formula 4]

16. A method of fabricating an organic thin film transistor (OTFT) comprising:
forming a gate electrode, a gate insulating film, an organic semiconductor layer, a source electrode and a drain electrode on a substrate, wherein the gate insulating film includes the organic insulating film fabricated according to claim 15.

17. The method according to claim 16, wherein the semiconductor layer is made of a material selected from the group consisting of pentacene, copper phthalocyanine, polythiophene, polyaniline, polyacetylene, polypyrrole, polyphenylene vinylene and a derivative of the materials.

18. The method according to claim 16, wherein the gate electrode, the source electrode and the drain electrode are made of a material selected from the group consisting of gold (Au), silver (Ag), nickel (Ni), aluminum (Al), indium tin oxide (ITO) and chrome (Cr).

19. The method according to claim 16, wherein the substrate is made of a material selected from the group consisting of glass, a silicon wafer, polyethylene terephthalate (PET), polycarbonate (PC), polyethersulfone (PES) and polyethylene naphthalate (PEN).

20. The method according to claim 16, wherein the OTFT has a top contact structure, a bottom contact structure or a top gate structure.

21. A method of fabricating an electronic device comprising:
fabricating the organic thin film transistor according to claim 16.

* * * * *